United States Patent
Loveless et al.

(10) Patent No.: US 10,236,900 B1
(45) Date of Patent: Mar. 19, 2019

(54) CAPACITIVE MISMATCH MEASUREMENT

(71) Applicant: TEXAS INSTRUMENTS INCORPORATED, Dallas, TX (US)

(72) Inventors: Steven John Loveless, Sachse, TX (US); Yuguo Wang, Plano, TX (US); Tathagata Chatterjee, Allen, TX (US); Robert Stanley Grondalski, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/836,976

(22) Filed: Dec. 11, 2017

(51) Int. Cl.
*H03K 5/24* (2006.01)
*H03M 1/10* (2006.01)
*G01R 27/26* (2006.01)
*H03K 21/08* (2006.01)

(52) U.S. Cl.
CPC ...... *H03M 1/1071* (2013.01); *G01R 27/2605* (2013.01); *H03K 5/24* (2013.01); *H03K 21/08* (2013.01)

(58) Field of Classification Search
None
See application file for complete search history.

(56) References Cited

U.S. PATENT DOCUMENTS

| 7,804,307 B1 * | 9/2010 | Bokma | G01R 27/2605 324/607 |
| 9,432,044 B1 * | 8/2016 | Lee | H03M 1/1061 |
| 2007/0268265 A1 * | 11/2007 | Xiaoping | G06F 3/044 345/173 |
| 2008/0312857 A1 * | 12/2008 | Sequine | G01D 5/24 702/65 |
| 2010/0231241 A1 * | 9/2010 | Mueck | G01D 1/00 324/686 |
| 2011/0074445 A1 * | 3/2011 | Nascimento | G01D 5/24 324/676 |
| 2016/0079995 A1 * | 3/2016 | Zare-Hoseini | H03M 1/1071 341/120 |

* cited by examiner

*Primary Examiner* — Howard Williams
(74) *Attorney, Agent, or Firm* — John R. Pessetto; Charles A. Brill; Frank D. Cimino

(57) ABSTRACT

An analog-to-digital converter (ADC) comprising successive approximation circuitry, a capacitive analog-to-digital converter (CDAC), and capacitor mismatch measurement circuitry. The successive approximation circuitry is configured to control conversion of an analog signal to a digital value. The CDAC is coupled to the successive approximation circuitry. The CDAC includes a plurality of capacitors. The capacitor mismatch measurement circuitry is coupled to the CDAC. The capacitor mismatch measurement circuitry includes a first oscillator circuit, a second oscillator circuit, and counter circuitry. The first oscillator circuit is configured to oscillate at a frequency determined by a capacitance of one of the capacitors. The second oscillator circuit is configured to generate a predetermined time interval. The counter circuitry is configured to count a number of cycles of oscillation of the first oscillator in the predetermined time interval.

12 Claims, 2 Drawing Sheets

CAPACITIVE MISMATCH MEASUREMENT

BACKGROUND

An analog-to-digital converter (ADC) is an electronic circuit that converts an analog signal into a digital value that represents the analog signal. One well-known type of ADC is a successive approximation register (SAR) ADC. A SAR ADC includes a digital-to-analog converter (DAC), which may be implemented with a series of capacitors and a number of switches. The capacitors have top plates that are connected together, and bottom plates that are individually connectable by way of the switches to an input voltage, a reference voltage, and ground.

The capacitors include a number of binary-valued capacitors, such as 1C, 2C, 4C, 8C, and 16C, where 1C represents the capacitance and plate area of the smallest capacitor that can be fabricated with a given process. A 16C capacitor has 16× the capacitance and plate area of the 1C capacitor, while an 8C capacitor has 8× the capacitance and plate area of the 1C capacitor.

The binary-valued capacitors include a 1C dummy capacitor that allows the capacitor values to be evenly divided. For example, the first four binary-valued capacitors (1C, 2C, 4C, 8C) in combination with the 1C dummy capacitor have a total capacitance of 16C, which is equal to the fifth binary-valued capacitor (16C). Similarly, the first three binary-valued capacitors (1C, 2C, 4C) in combination with the 1C dummy capacitor have a total capacitance of 8C, which is equal to the fourth binary-valued capacitor (8C).

Each of the binary-valued capacitors, with the exception of the dummy capacitor, corresponds to a bit in the digital word output by the SAR ADC. For example, a SAR ADC that outputs a five-bit word typically has six binary-valued capacitors, five bit capacitors and one dummy capacitor.

The largest binary-valued capacitor (16C in the present example) represents the most significant bit (MSB), while the smallest binary-valued capacitor (1C in the present example) represents the least significant bit (LSB). In addition to the capacitive-based DAC, a SAR ADC also includes a comparator and a controller.

In operation, the capacitive-based DAC receives a sequence of control words from a DAC controller, which controls the positions of the switches which, in turn, determine whether the input voltage, the reference voltage, or ground is connected to the binary-weighted capacitors.

The sequence of connecting and reconnecting the voltages generates a sequence of DAC voltages at the input of the comparator, which compares the sequence of DAC voltages to ground, and outputs a sequence of logic values that represents the results of the comparisons. The controller interprets the sequence of logic values, and sequentially assigns a logic state to each bit position in the digital word that represents the input voltage.

A high-resolution SAR ADC can be formed by increasing the number of bits within the digital word that represents the input voltage. For example, a SAR ADC that outputs a 10-bit word has a much higher resolution than a SAR ADC that outputs a 5-bit word. However, as the number of bits increase, the size of the largest binary-valued capacitor significantly increases. The largest capacitor in a 5-bit word is 16× larger than the smallest capacitor, whereas the largest capacitor in a 10-bit word is 512× larger. Accordingly, a high resolution SAR ADC may include a large number of capacitors.

SUMMARY

Circuits for measuring mismatch of capacitors in an integrated circuit are disclosed herein. In one example, an analog-to-digital converter (ADC) includes successive approximation circuitry, a capacitive analog-to-digital converter (CDAC), and capacitor mismatch measurement circuitry. The successive approximation circuitry is configured to control conversion of an analog signal to a digital value. The CDAC is coupled to the successive approximation circuitry. The CDAC includes a plurality of capacitors. The capacitor mismatch measurement circuitry is coupled to the CDAC. The capacitor mismatch measurement circuitry includes a first oscillator circuit, a second oscillator circuit, and counter circuitry. The first oscillator circuit is configured to oscillate at a frequency determined by a capacitance of one of the capacitors. The second oscillator circuit is configured to generate a predetermined time interval. The counter circuitry is configured to count a number of cycles of oscillation of the first oscillator in the predetermined time interval.

In another example, a system for measuring capacitive mismatch includes a plurality of capacitors, a first oscillator circuit, a second oscillator circuit, and counter circuitry. The first oscillator circuit is configured to oscillate at a frequency determined by a capacitance of one of the capacitors. The second oscillator circuit is configured to generate a predetermined time interval. The counter circuitry is configured to count a number of cycles of oscillation of the first oscillator in the predetermined time interval.

In a further example, a method for measuring capacitor mismatch includes switching a first capacitor into a first relaxation oscillator, and generating a clock signal output at a first frequency by the first relaxation oscillator. The method also includes generating a clock signal output by a second relaxation oscillator, and counting a predetermined number of cycles of the clock signal output by the second relaxation oscillator to generate a measurement interval. The method further includes counting a number of cycles of the clock signal output by the first relaxation oscillator in the measurement interval, and determining a difference between the first capacitor and a different capacitor based on the number of cycles of the clock signal output by the first relaxation oscillator in the measurement interval.

BRIEF DESCRIPTION OF THE DRAWINGS

For a detailed description of various examples, reference will now be made to the accompanying drawings in which:

FIG. 3 shows a flow diagram for a method for measuring capacitor mismatch in accordance with various examples.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Capacitive digital-to-analog converters (CDACs) used in successive approximation analog-to-digital converters (ADCs) can employ a large number of unit capacitors arranged to form the binary capacitance values of the CDAC. To compensate for variation in the capacitance of the unit capacitors, the mismatch between capacitors is measured. Measurement of low value (pico-farad and less) unit capacitor mismatch in a large array of capacitors can require elaborate test structures, simulation and extraction for calibration, and is limited by noise, precision and stability of test equipment.

Examples of the present disclosure include capacitor mismatch measurement circuitry to determine the difference between capacitors of a capacitor array. The capacitor mismatch measurement circuitry includes a first relaxation oscillator and switching circuitry to switch each of the capacitors into the first relaxation oscillator. The capacitor mismatch measurement circuitry also includes a second relaxation oscillator to generate a measurement interval. A counter counts the number of cycles output by the first relaxation oscillator during the measurement interval. A difference in the capacitance of the capacitor operating in the first relaxation oscillator and a different capacitor of the capacitor array is determined based on the number of cycles output by the first relaxation oscillator during the measurement interval.

While the capacitor mismatch measurement circuitry disclosed herein is described with respect to measuring mismatch of the capacitors of a CDAC, variations of the capacitor mismatch measurement circuitry may be implemented in any application in which measurement of mismatch between capacitors is desirable. For example, the capacitor mismatch circuit of the present disclosure may be applied in sensors that include an array of capacitors to measure stress, deformation, material variation, incident energy, etc. to determine mismatch between the capacitors of the sensor.

Figure 1:
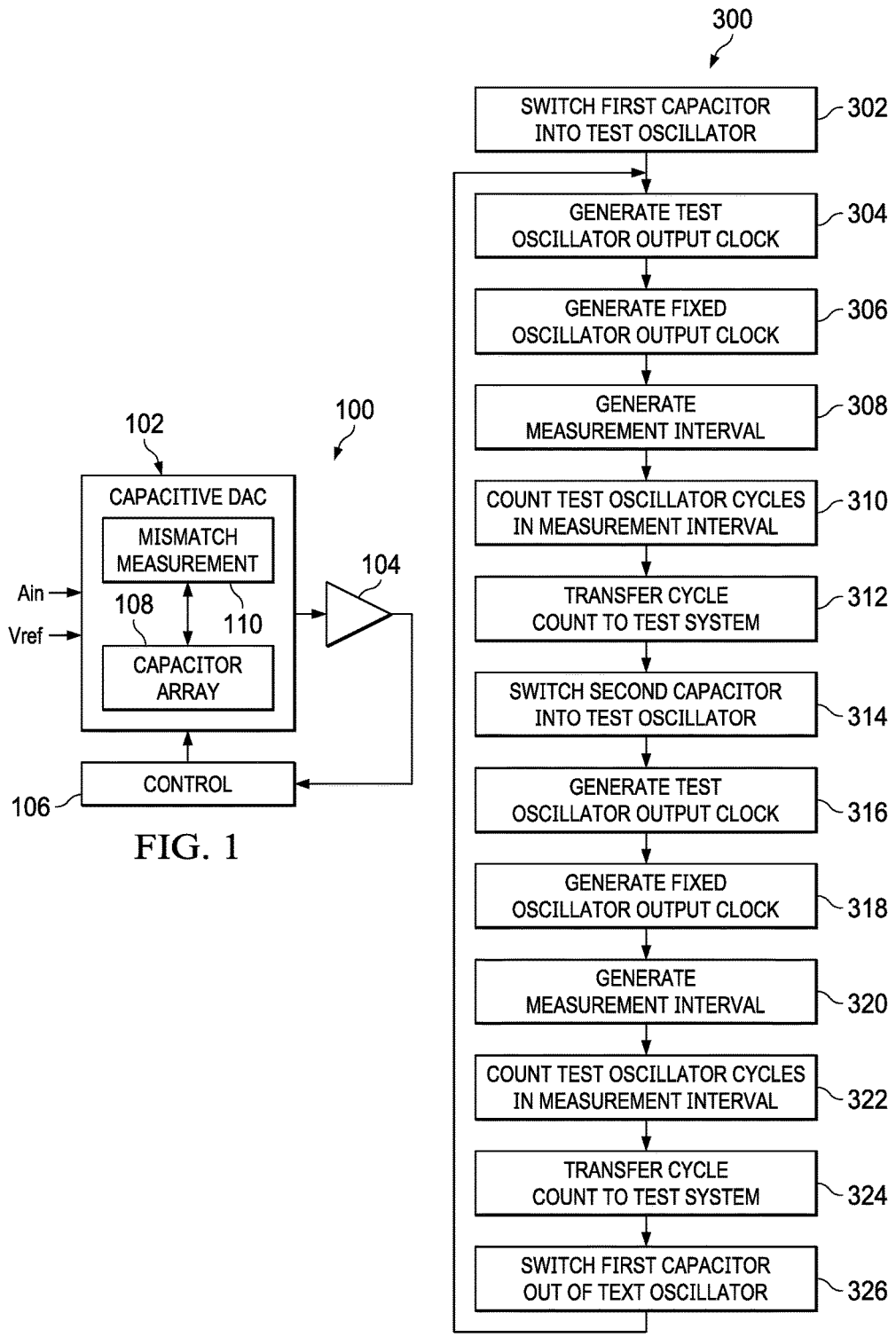
FIG. 1 shows a block diagram of a successive approximation analog-to-digital converter that includes capacitor mismatch measurement circuitry in accordance with various examples.

FIG. 1 shows a block diagram of a successive approximation ADC that includes capacitor mismatch measurement circuitry in accordance with various examples. The successive approximation ADC 100 includes a CDAC 102, a comparator 104, and control circuitry 106. Analog signal (Ain) to be digitized and one or more reference voltages (Vref) are received by the CDAC 102. The CDAC 102 is coupled to the comparator 104, and the output of the CDAC 102 is provided as an input to the comparator 104. The comparator 104 compares the output of the CDAC 102 to a reference voltage (e.g., ground). In some implementations, the CDAC 102 outputs a differential signal to the comparator 104 and the comparator 104 compares the two signals that make up the differential signal. The output of the comparator 104 indicates whether the output of the CDAC 102 exceeds a threshold. For example, the threshold may represent voltage corresponding to a particular bit of the digital value produced by the SAR ADC 100.

The control circuitry 106 receives the output of the comparator 104. The control circuitry 106 includes successive approximation circuitry that includes a successive approximation register for storage of the bits generated during digitization of Ain, and logic (e.g., state machine logic) to control the operation of the CDAC 102 during digitization of Ain.

The CDAC 102 includes a capacitor array 108 and mismatch measurement circuitry 110. In some implementations of the ADC 100, the mismatch measurement circuitry 110 may be separate from (e.g., external to) the CDAC 102. The capacitor array 108 includes a plurality of capacitors. For example, in an 8-bit implementation of the CDAC 102, the capacitor array 108 may include 256 capacitors. Some examples of the capacitor array 108 may include more or fewer capacitors in accordance with number of bits represented in the CDAC 102. In order to effectively compensate for mismatch between the capacitors, the mismatch between the capacitors must be measured. The mismatch measurement circuitry 110 measures a value corresponding to the capacitance of each of the capacitors of the capacitor array 108. Comparison of the values measured for different capacitors produces a measure of the mismatch between the capacitors. The measured mismatch may be used to trim the capacitors, thereby reducing inaccuracy in the CDAC 102 and improving the accuracy of the successive approximation ADC 100.

Figure 2:
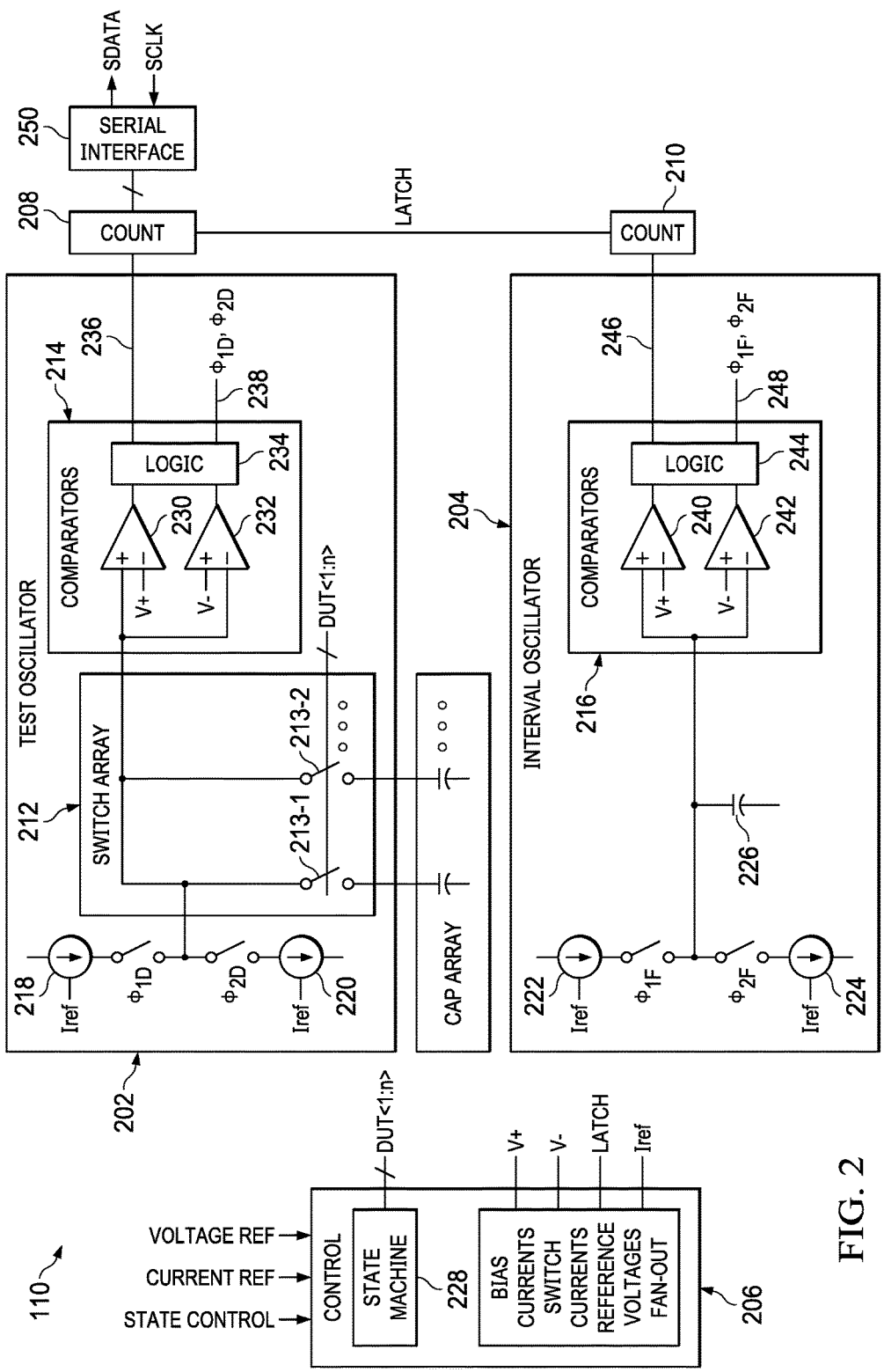
FIG. 2 shows a block diagram of capacitor mismatch circuitry in accordance with various examples.

FIG. 2 shows a block diagram of capacitor mismatch circuitry 110 in accordance with various examples. The capacitor mismatch circuitry 110 includes a test oscillator (i.e., test oscillator circuitry) 202, an interval oscillator (i.e., interval oscillator circuitry) 204, control circuitry 206, counter circuitry 208, and counter circuitry 210. The test oscillator 202 is a relaxation oscillator and includes a switch array 212, comparator circuitry 214, current source 218 and current sink 220. The switch array 212 includes a plurality of switches 213-1, 213-2, etc. Each of the switches 213 is connected to one of the capacitors of the CDAC 102 and is closable to connect the capacitor to the test oscillator 202. In some implementations, multiple switches 213 may be closed to connect two or more capacitors of the CDAC 102 to the test oscillator 202 at the same time. The current source 218 provides charging current to the capacitor of the CDAC 102 that is connected to the test oscillator 102. The current sink 220 discharges the capacitor of the CDAC 102 that is connected to the test oscillator 102.

The comparator circuitry 214 includes a charge comparator 230 and a discharge comparator 232. The charge comparator 230 compares the voltage across the capacitor of the CDAC 102 that is connected to the test oscillator 102 to a first reference voltage. The discharge comparator 232 compares the voltage across the capacitor of the CDAC 102 that is connected to the test oscillator 102 to a second reference voltage. As the capacitor is charged, and the voltage across the capacitor increases to exceed the first reference voltage, the output of the charge comparator 203 is asserted to discontinue charging and initiate discharging of the capacitor. Similarly, as the capacitor is discharged, and the voltage across the capacitor decreases to fall below the second reference voltage, the output of the discharge comparator 203 is asserted to discontinue discharging and initiate charging of the capacitor. Circuitry 234 coupled to the comparators 230 and 232 applies the outputs of the comparators 230 and 232 to generate a clock signal 236 and control signals 238. The frequency of the clock signal 236 is a function of the capacitance of the capacitor of the CDAC 102 that is connected to the test oscillator 102. The control signals 238 control charging and discharging of the capacitor of the CDAC 102 that is connected to the test oscillator 102 by connecting and disconnecting the current source 218 and the current sink 220 from the capacitor.

The interval oscillator 204 is a relaxation oscillator and includes a capacitor 226, comparator circuitry 216, current source 222 and current sink 224. The capacitor 226 has a fixed value. Accordingly, the output frequency of the interval oscillator 204 is fixed. The current source 222 provides charging current to the capacitor 226. The current sink 224 discharges the capacitor 226.

The comparator circuitry 216 includes a charge comparator 240 and a discharge comparator 242. The charge comparator 240 compares the voltage across the capacitor 226 to a first reference voltage. The discharge comparator 242 compares the voltage across the capacitor 226 to a second reference voltage. As the capacitor 226 is charged, and the voltage across the capacitor 226 increases to exceed the first reference voltage, the output of the charge comparator 240 is asserted to discontinue charging and initiate discharging of the capacitor 226. Similarly, as the capacitor 226 is discharged, and the voltage across the capacitor 226 decreases to fall below the second reference voltage, the output of the discharge comparator 242 is asserted to discontinue discharging and initiate charging of the capacitor 226. Circuitry 244 coupled to the comparators 240 and 242 applies the outputs of the comparators 240 and 242 to generate a clock signal 246 and control signals 248. The frequency of the clock signal 246 is a function of the capacitance of the capacitor 226. The control signals 248 control charging and discharging of the capacitor 226 by connecting and disconnecting the current source 222 and the current sink 224 from the capacitor 226.

The counter circuitry 210 is coupled to the interval oscillator 204. The counter circuitry 210 counts a predetermined number of cycles of the clock signal 246 to generate a time interval. The time interval generated by the counter circuitry 210 is applied to enable the counter circuitry 208, and/or to latch a count value accumulated by the counter circuitry 208 during the time interval. The counter circuitry 208 counts cycles of the clock signal 236 during the time interval generated by the counter circuitry 210. Because the frequency of the clock signal 236 is a function of the capacitance of the capacitor of the CDAC 102 that is switchably connected to the test oscillator 202, the count value accumulated by the counter circuitry 208 in the time interval generated by the counter circuitry 210 is also a function of the capacitance of the capacitor of the CDAC 102 that is switchably connected to the test oscillator 202.

The communication circuitry 250 may transfer the count of the cycles of the clock signal 236 accumulated by the counter circuitry 208 to a test system external to the ADC 100 (e.g., via a serial communication interface). The test system may compare the count values produced by connecting various capacitors of the CDAC 102 to the test oscillator 202 to quantify the mismatch between the capacitors.

The control circuitry 206 generates signals that control the switch array 212 to test each of the capacitors of the CDAC 102. For example, the control circuitry 206 may generate switch control signals to close a switch 213 and connect a first capacitor of the CDAC 102 to the test oscillator 202, initiate generation of a time interval by the counter circuitry 210, and measurement of the number of cycles of the clock 236 generated by the test oscillator 202. The control circuitry 206 may also generate switch control signals to close two switches 213 and connect the first capacitor of the CDAC 102 and a second capacitor of the CDAC 102 to the test oscillator 202 at the same time. With two capacitors of the CDAC 102 connected to the test oscillator 202, the control circuitry 206 may initiate generation of a time interval by the counter circuitry 210, and measurement of the number of cycles of the clock 236 generated by the test oscillator 202.

FIG. 3 shows a flow diagram for a method for measuring mismatch of capacitors of an integrated circuit in accordance with various examples. Though depicted sequentially as a matter of convenience, at least some of the actions shown can be performed in a different order and/or performed in parallel. Additionally, some implementations may perform only some of the actions shown. At least some of the operations of the method 300 may be performed by the mismatch measurement circuitry 110.

In block 302, the mismatch measurement circuitry 110 closes a first of the switches 213 to connect a first of the capacitors of the CDAC 102 to the test oscillator 202.

In block 304, the test oscillator 202 generates an output clock signal 236. The frequency of the clock signal 236 is a function of the capacitor of the CDAC 102 connected to the test oscillator 202 in block 302.

In block 306, the interval oscillator 204 generates an output clock signal 246. The frequency of the clock signal 246 is function of the capacitor 226.

In block 308, the counter circuitry 210 counts a number of cycles of the clock signal 246 to generate a measurement time interval.

In block 310, the counter circuitry 208 counts the number of cycles of the clock 236 in the measurement time interval generated by the counter circuitry 210.

In block 312, the mismatch measurement circuitry 110 transmits the count value accumulated by the counter circuitry 208 in block 310 to a test system external to the ADC 100 for use in determining the mismatch between capacitors of the CDAC 102.

In block 314, the mismatch measurement circuitry 110 closes a second of the switches 213 to connect a second of the capacitors of the CDAC 102 to the test oscillator 202, in conjunction with the first of the capacitors of the CDAC 102 connected to the test oscillator 202 in block 302.

In block 316, the test oscillator 202 generates an output clock signal 236. The frequency of the clock signal 236 is a function of the combined capacitance of the capacitors of the CDAC 102 connected to the test oscillator 202 in blocks 302 and 312.

In block 318, the interval oscillator 204 generates an output clock signal 246. The frequency of the clock signal 246 is function of the capacitor 226.

In block 320, the counter circuitry 210 counts a number of cycles of the clock signal 246 to generate a measurement time interval.

In block 322, the counter circuitry 208 counts the number of cycles of the clock 236 in the measurement time interval generated by the counter circuitry 210.

In block 324, the mismatch measurement circuitry 110 transmits the count value accumulated by the counter circuitry 208 in block 322 to a test system external to the ADC 100 for use in determining the mismatch between capacitors of the CDAC 102.

In block 326, the mismatch measurement circuitry 110 opens the first of the switches to disconnect the first of the capacitors of the CDAC 102 from the test oscillator 202. Testing of the second capacitor of the CDAC 102 continues in block 304.

Given the count values accumulated using a number of the capacitors of the CDAC 102 (both individual capacitors and capacitor pairs) the test system external to the ADC 100 can determine the mismatch between capacitors of the CDAC 102 as:

$$\frac{C_1 - C_2}{\hat{C}} = \frac{\tau_1 - \tau_2}{\hat{\tau}_x + (\tau_{12} - \tau_1 - \tau_2)} =$$

$$\frac{\frac{K}{F_1} - \frac{K}{F_2}}{\frac{K}{\hat{F}_x} + \left(\frac{K}{F_{12}} - \frac{K}{F_1} - \frac{K}{F_2}\right)} = \frac{\frac{1}{F_1} - \frac{1}{F_2}}{\frac{1}{\hat{F}_x} + \left(\frac{1}{F_{12}} - \frac{1}{F_1} - \frac{1}{F_2}\right)}$$

where:
$C_1$ is the capacitance of a first capacitor of the CDAC 102;
$C_2$ is the capacitance of a second capacitor of the CDAC 102;
$\hat{C}$ is the average capacitance of the capacitors of the CDAC 102;
$\tau_1$ is the time constant of the switching frequency with the test oscillator 202 using $C_1$;
$\tau_2$ is the time constant of the switching frequency with the test oscillator 202 using $C_2$;
$\tau_{12}$ is the time constant of the switching frequency with the test oscillator 202 using $C_1$ in conjunction with $C_2$;
$\hat{\tau}_x$ is the average time constant of the switching frequency of the test oscillator 202 using the capacitors of the CDAC 102;
K is the timebase (i.e., measurement interval) for counting cycles of the test oscillator 202 output clock frequency;
$F_1$ is the number of cycles counted in K with the test oscillator 202 using $C_1$;
$F_2$ is the number of cycles counted in K with the test oscillator 202 using $C_2$;
$F_{12}$ is the number of cycles counted in K with the test oscillator 202 using $C_1$ in conjunction with $C_2$; and
$\hat{F}_x$ is the average number of cycles counted in K with the test oscillator 202 using the capacitors of the CDAC 102.

The above discussion is meant to be illustrative of the principles and various implementations of the present invention. Numerous variations and modifications will become apparent to those skilled in the art once the above disclosure is fully appreciated. It is intended that the following claims be interpreted to embrace all such variations and modifications.

What is claimed is:

1. An analog-to-digital converter (ADC) comprising:
   successive approximation circuitry configured to control conversion of an analog signal to a digital value;
   a capacitive analog-to-digital converter (CDAC) coupled to the successive approximation circuitry, the CDAC comprising a plurality of capacitors; and
   capacitor mismatch measurement circuitry coupled to the CDAC, the capacitor mismatch measurement circuitry comprising:
      a first oscillator circuit configured to oscillate at a frequency determined by a capacitance of one of the capacitors; and
      a second oscillator circuit configured to generate a predetermined time interval; and
      counter circuitry configured to count a number of cycles of oscillation of the first oscillator in the predetermined time interval.

2. The ADC of claim 1, wherein the first oscillator circuit comprises:
   a comparator;
   a plurality of switches, each of the switches configured to connect one of the capacitors to the comparator; and
   a current source configured to generate a current to charge the one of the capacitors connected to the comparator.

3. The ADC of claim 2, further comprising control circuitry configured to control the plurality of switches to individually connect each of the capacitors to the comparator.

4. The ADC of claim 3, wherein the control circuitry is configured to control the plurality of switches to connect each of the capacitors to the comparator in parallel with a different one of the capacitors.

5. The ADC of claim 1, wherein the second oscillator circuit comprises:
   a comparator;
   a capacitor; and
   a current source configured to generate a current to charge the capacitor connected to the comparator.

6. The ADC of claim 1, wherein the counter circuitry comprises:
   a first counter configured to generate the predetermined time interval as a predetermined number of cycles of oscillation of the second oscillator; and
   a second counter configured to count the number of cycles of oscillation of the first oscillator in the predetermined time interval.

7. The ADC of claim 1, further comprising communication circuitry configured to transmit the count of the number of cycles of oscillation of the first oscillator in the predetermined time interval to a device external to the ADC.

8. A method for measuring capacitor mismatch, comprising:
   switching a first capacitor into a first relaxation oscillator;
   generating a clock signal output at a first frequency by the first relaxation oscillator;
   generating a clock signal output by a second relaxation oscillator;
   counting a predetermined number of cycles of the clock signal output by the second relaxation oscillator to generate a measurement interval;
   counting a number of cycles of the clock signal output by the first relaxation oscillator in the measurement interval;
   determining a difference between the first capacitor and a different capacitor based on the number of cycles of the clock signal output by the first relaxation oscillator in the measurement interval;
   switching a second capacitor into the first relaxation oscillator in conjunction with the first capacitor; and
   generating the clock signal output by the first relaxation oscillator at a second frequency based on the first capacitor and the second capacitor.

9. The method of claim 8, further comprising counting a number of cycles of the clock signal output by the first relaxation oscillator at the second frequency in the measurement interval.

10. The method of claim 9, further comprising determining a difference between the first capacitor and a different capacitor based on the number of cycles of the clock signal output by the first relaxation oscillator at the second frequency in the measurement interval.

11. The method of claim 8, further comprising:
   switching the first capacitor out of the first relaxation oscillator; and
   generating the clock signal output by the first relaxation oscillator at a third frequency based on the second capacitor.

12. The method of claim 11, further comprising:
   counting a number of cycles of the clock signal output by the first relaxation oscillator at the third frequency in the measurement interval; and determining a difference between the second capacitor and a different capacitor based on the number of cycles of the clock signal output by the first relaxation oscillator in the measurement interval.

* * * * *